(12) United States Patent
Schuette et al.

(10) Patent No.: US 8,738,848 B2
(45) Date of Patent: May 27, 2014

(54) METHODS, STORAGE DEVICES, AND SYSTEMS FOR PROMOTING THE ENDURANCE OF NON-VOLATILE SOLID-STATE MEMORY COMPONENTS

(75) Inventors: Franz Michael Schuette, Colorado Springs, CO (US); Anthony Leach, Stockport (GB)

(73) Assignee: OCZ Storage Solutions Inc., San Jose, CA (US)

( * ) Notice: Subject to any disclaimer, the term of this patent is extended or adjusted under 35 U.S.C. 154(b) by 232 days.

(21) Appl. No.: 13/337,482

(22) Filed: Dec. 27, 2011

(65) Prior Publication Data
US 2012/0166716 A1   Jun. 28, 2012

Related U.S. Application Data

(60) Provisional application No. 61/427,498, filed on Dec. 28, 2010.

(51) Int. Cl.
*G06F 12/00*   (2006.01)

(52) U.S. Cl.
USPC .......................................... 711/103; 711/156

(58) Field of Classification Search
None
See application file for complete search history.

(56) References Cited

U.S. PATENT DOCUMENTS

2003/0046483 A1* 3/2003 Moschopoulos ............. 711/103

* cited by examiner

*Primary Examiner* — Shawn X Gu
(74) *Attorney, Agent, or Firm* — Hartman Global IP Law; Gary M. Hartman; Michael D. Winter

(57) ABSTRACT

Solid-state mass storage devices, host computer systems, and methods of managing non-volatile solid-state memory components used therein. The memory components comprise memory cells organized in functional units that are adapted to receive units of data transferred from the host computer system and correspond to the functional units of the memory component. The level of programming for each cell is reduced by performing an analysis of the bit values of the units of data to be written to at least a first of the functional units of the memory component. Depending on the analysis of "0" and "1" bit values of the units of data to be written, the bit values are inverted before writing the units of data to the first memory component.

21 Claims, 4 Drawing Sheets

Page values: 1 page = 4096 Bytes = 32768 bits

| Bit # | 0 | 1 | 2 | 3 | 4 | 5 | 6 | 7 | 8 | 9 | 10 | 11 | 12 | 13 | ... | 32765 | 32766 | 32767 |
|---|---|---|---|---|---|---|---|---|---|---|---|---|---|---|---|---|---|---|
| Bit Value | 1 | 0 | 1 | 1 | 0 | 1 | 0 | 0 | 0 | 0 | 1 | 1 | 1 | 1 | ... | 0 | 1 | 1 | 0 |

$$\text{Average} = \frac{\text{sum(bit value \#0 - bit value \#32767)}}{32768}$$

FIG. 1

Page values: 1 page = 4096 Bytes = 40960 bits

| Bit # | 0 | 1 | 2 | 3 | 4 | 5 | 6 | 7 | 8 | 9 | 10 | 11 | 12 | 13 | ... | 40957 | 40958 | 40959 |
|---|---|---|---|---|---|---|---|---|---|---|---|---|---|---|---|---|---|---|
| Bit Value | 1 | 0 | 1 | 1 | 0 | 1 | 0 | 0 | 0 | 0 | 1 | 1 | 1 | 1 | ... | 0 | 1 | 1 | 0 |

$$\text{Average} = \frac{\text{sum(bit value \#0 - bit value \#40959)}}{40960}$$

METHODS, STORAGE DEVICES, AND SYSTEMS FOR PROMOTING THE ENDURANCE OF NON-VOLATILE SOLID-STATE MEMORY COMPONENTS

CROSS REFERENCE TO RELATED APPLICATIONS

This application claims the benefit of U.S. Provisional Application No. 61/427,498, filed Dec. 28, 2010, the contents of which are incorporated herein by reference.

BACKGROUND OF THE INVENTION

The present invention generally relates to non-volatile (permanent) memory-based mass storage devices for use with computers and other processing apparatuses. More particularly, this invention relates to the use of solid-state drives using NAND flash or Phase Change Memory devices as non-volatile memory components.

Mass storage devices such as advanced technology attachment (ATA) drives and small computer system interface (SCSI) drives are rapidly adopting non-volatile memory technology, such as flash memory or another emerging solid-state memory technology including phase change memory (PCM), resistive random access memory (RRAM), magnetoresistive random access memory (MRAM), ferromagnetic random access memory (FRAM), organic memories, or nanotechnology-based storage media such as carbon nanofiber/nanotube-based substrates. Currently the most common solid-state technology uses NAND flash memory components as inexpensive storage memory, often in a form commonly referred to as a solid-state drive (SSD).

Briefly, flash memory components store information in an array of floating-gate transistors (FGTs), referred to as cells. The cell of a NAND flash memory component has a top gate (TG) connected to a word (or control) line and a floating gate (FG), the latter being sandwiched between the top gate and the channel of the cell. The floating gate is separated from the channel by a layer of tunnel oxide. Data are stored in (written to) a NAND flash cell in the form of a charge on the floating gate which, in turn, defines the channel properties of the NAND flash cell by either augmenting or opposing a charge on the top gate.

Data are erased from a NAND flash cell by applying an erase voltage to the device substrate, which then pulls electrons from the floating gate over an extended period of time. Charging (programming) of the floating gate is done by applying short pulses of a high positive voltage (typically 18-20V) to the word line that is connected to the top or programming gate. The resulting electrical field draws electrons from the substrate through the tunnel oxide layer into the floating gate until the desired level of charge of the floating gate is achieved and verified by a subsequent read of the cell's bit value. The physics behind both programming and erasing are referred to as Fowler Nordheim quantum-mechanical tunneling or else as injection of electrons into the floating gate.

From the above description it should be clear that the programming can only change the charge of any given floating gate from a fully erased state toward a fully programmed state, which is often described as the unidirectional programmability of NAND flash cells. That is, any NAND flash cell will have a fully erased state that, by convention, is equivalent to a "1" value of the stored bit and it is possible to program the cell thereafter to a "0" bit value but not vice versa. In multi-level cell (MLC) NAND flash memory devices, more than two levels of charge are injected into the FG, allowing n bits per cell as long as $2^n$ charge levels of the floating gate can be reliably resolved within a predetermined range of possible control voltages applied to the control gates to turn the gate ON. Similar to single-level cell (SLC) NAND flash memory, naming practices have been adopted for identifying the erased and programmed states of an MLC NAND flash memory cell. As an example, in the case of an MLC flash memory having four different levels to encode two bits per cell, possible bit values are "11" (fully erased), "10" (partially programmed), "01" (partially programmed), and "00" (fully programmed). However, as mentioned above, programming can only shift cells to a lower value, and programming in the opposite direction is not possible.

On a more macroscopic level, NAND flash cells are organized in the form of pages. Specifically, NAND flash memory devices typically use thirty-two serially connected FGTs as the smallest unit where each FGT defines a memory cell. Several of these daisy chains form a page wherein the number of chains is always a power of two. NAND flash memory pages, in turn, are combined into memory blocks. Each block is a predetermined section of the NAND flash memory component. A NAND flash memory component allows data to be stored and retrieved on a page by page basis, in some cases even on a fraction of a page (sub-page). These may be referred to as the smallest functional or writable unit of the memory component. In contrast, erasing NAND flash memory can only be done on a block-by-block basis. For example, erasing cells is done by connecting all FGT daisy chains within a block via a select transistor to an erase voltage of typically +20V while connecting the other end of the chains via a second select transistor to ground. A simplified description of this process would be the application of a positive voltage to the device substrate on a per block basis. Since all pages are a serial daisy chain of FGTs, the erase current flows through all FGTs and consequently, the erase process does not allow isolation of individual cells. Moreover, for the purpose of simplicity of the design, NAND flash memory ties all pages within a block to a common erase switch, therefore, erasing of NAND flash memory cells can only be done on a per block basis. As a result, the minimum erasable size is an entire block, and, therefore every time a cell is being rewritten, the entire block needs to be erased.

Over time, NAND flash memory cells wear out. The Fowler-Nordheim tunneling used to inject the electrons into the floating gate by drawing them through the tunnel oxide layer and the subsequent erasure by applying a positive voltage to the channel, thereby reversing the electron charge by drawing them back through the tunnel oxide layer, is extremely harsh on the tunnel oxide layer. The electrical fields that are applied are on the order of 10 million V/cm which can cause breaking of atomic bonds in the oxide layer, and consequent trapping of electrons at the broken atomic bond sites. An exacerbating factor in this context is the problem that the tunnel oxide layer becomes thinner and, by extension, more fragile with every migration to a new and smaller manufacturing process node. As a consequence, write endurance that used to be 10,000 program/erase (P/E) cycles at a 65 nm process geometry has decreased to about 3000 to 5000 P/E cycles at 30 nm process node and continues to decline toward roughly 1000 P/E cycles at 2x nm process nodes. Limited life span and endurance of NAND flash memory are becoming extremely critical factors in any considerations of NAND flash-based storage media.

The endurance of a NAND memory cell is typically quantified as the number of program/erase cycles the cell can be subjected to before it becomes unreliable. Accordingly, the endurance of a particular NAND cell is dependent on the number of P/E cycles that the cell has been subjected to. The pattern of data written to the NAND flash also affects endurance. In short, if cells are programmed to a higher level, that means that more electrons have passed through the oxide layer. If cells are programmed merely to a "1" level, that means that they stay at the fully erased level and no electrons are drawn through the oxide layer, nor are electrons drawn "back" through the oxide layer on the next erase cycle. It should be obvious that this level of programming has fewer adverse effects on the tunnel oxide layer than a fully programmed level and subsequent erase. Moreover, if an entire block is programmed to byte values of "FF", meaning that all bits are set to "1" then no or very little erase is necessary before any additional programming. Because programming and erasing is typically performed by applying pulses of programming and erase voltage, respectively, until the desired charge value of the floating gate has been achieved (which is sensed through verification performed between pulses), programming a cell to the fullest programmed value requires more or longer programming pulses and erasing such a fully programmed cell requires more erase pulses per P/E cycle.

In view of the problem outlined above, it appears desirable to find a way to reduce the level of programming of any given NAND flash memory cell in order to reduce stress on the tunnel oxide layer and accordingly increase the endurance of the NAND flash memory cell.

BRIEF DESCRIPTION OF THE INVENTION

The present invention discloses methods of managing solid-state mass storage devices adapted for use with host computer systems for the purpose of increasing the endurance of non-volatile solid-state memory components of the mass storage devices.

According to a first aspect of the invention, a mass storage device includes at least one non-volatile solid-state memory component comprising memory cells organized in functional units that are adapted to receive units of data transferred from a host computer system and correspond to the functional units of the memory component. The method is capable of minimizing the level of programming for each cell by performing an analysis of the bit values of the units of data to be written to at least a first of the functional units of the memory component. Depending on the analysis of "0" and "1" bit values of the units of data to be written, the bit values are inverted before writing the units of data to the first memory component.

According to a particular aspect of the invention, the method described above can be applied to a NAND flash memory component to generate the lowest programming load for a page in the memory component. Upon translating a unit of data to be written to the page of the NAND flash memory component, the average bit value of the unit of data is calculated and compared against a predetermined threshold value. If the average bit value is above the threshold value, no inversion of the bit values of the unit of data is performed prior to writing the units of data to the memory component. However, if the average bit value is below the threshold value, all bit values of the unit of data are inverted prior to writing the units of data to the memory component. Preferably, during writing of the units of data to the memory component, an additional status bit is set to identify the data inversion.

According to another particular aspect of the invention, the method described above can be applied to a memory technology other than NAND flash memory components, for example, phase change memory, which does not require a pre-erase operation before writing (in other words, a directly rewritable memory technology). In this case, the existing data in the functional unit is read and then compared to the unit of data to be written to the functional unit. According to the relative number of memory cells whose bit values would be altered by writing the unit of data to the functional unit, the unit of data is written to the functional unit as-is or a bit value inversion is performed before writing the unit of data to the memory component. Differentials in the energy required to alter a bit from one state to the other or vice-versa can be considered when determining the threshold value at which bit value inversion becomes advantageous.

According to a second aspect of the invention, a solid-state mass storage device adapted for use with a host computer system includes at least one non-volatile solid-state memory component comprising memory cells organized in pages. The mass storage device includes means for analyzing bit values in units of data to be written to the memory component, wherein each of the units of data corresponds to one of the pages in the memory component. The mass storage device also has means for computing an average bit value for each of the units of data, and means for performing a bit value inversion of at least a first of the units of data if the average bit value of the first unit of data is lower than a threshold value. The bit value inversion is performed before writing the first unit of data to the memory component.

According to a third aspect of the invention, a solid-state mass storage device adapted for use with a host computer system includes at least one non-volatile solid-state memory component organized in functional units that are adapted to receive units of data transferred from the host computer system in the form of sectors or logical allocation units (hereinafter, referred to simply as sectors) having addresses and sizes corresponding to the functional units of the memory component. The mass storage device further includes means for comparing bit values in the sectors of the data transferred from the host computer system to bit values of pre-existing data stored in the functional units of the memory component to determine whether the bit values of the pre-existing data stored in any of the functional units are different from the bit values in the sectors of the data to be stored in the functional units. The mass storage device also includes means for performing a bit value inversion of at least a first of the sectors of the data if the number of bit values of the pre-existing data stored in a corresponding first of the functional units and determined to be different exceeds a threshold value. The bit value inversion is performed before writing the first sector of the data to the first functional unit of the memory component.

According to a fourth aspect of the invention, a host computer system is provided with a solid-state mass storage device that interfaces with the host computer so as to store data received from the host computer system on at least one non-volatile solid-state memory component of the mass storage device. The memory component comprises memory cells organized in functional units that are adapted to receive units of the data received from the host computer system and correspond to the functional units of the memory component. The host computer system includes means for analyzing bit values in the units of data to be written to the memory component, means for computing an average bit value for each of the units of data, and means for performing a bit value inversion of at least a first of the units of data if the average bit value of the first unit of data is lower than a threshold value. The bit value inversion is performed before writing the first unit of data to the memory component. The host computer system also includes means for marking the first unit of data with an inversion bit if bit values of the first unit of data are inverted before being written to the memory component.

A technical effect of the invention is the ability to reduce the level of programming of memory cells of non-volatile solid-state memory components in order to reduce stress on the tunnel oxide layers of the cells and, accordingly, increase the endurance of the cells. In particular, the invention provides for bit value inversions of data being written to the memory components in order to minimize the number of P/E pulses to which the cells are subjected when data are written to the memory components or blocks are erased.

Other aspects and advantages of the invention will be better appreciated from the following detailed description.

BRIEF DESCRIPTION OF THE DRAWINGS

FIG. 1 is a representation of different bit values across a page or 4 kByte sector of data to be written to a NAND flash memory component adapted to use an 8 bits/Byte conversion for 32768 bits, and further represents the calculation of an average bit value.

FIG. 3 is a representation of a page or 4 kByte sector of data to be written to a NAND flash memory component adapted to use an 8b/10b encoding, and further represents the calculation of an average bit value.

FIGS. 4 and 5 contain representations of pre-existing data contained in a 4 kByte sector of a non-volatile solid-state memory component other than a NAND flash memory component, and represent two different scenarios for bit values of data to be stored in the sector containing the pre-existing data.

DETAILED DESCRIPTION OF THE INVENTION

Figure 2:
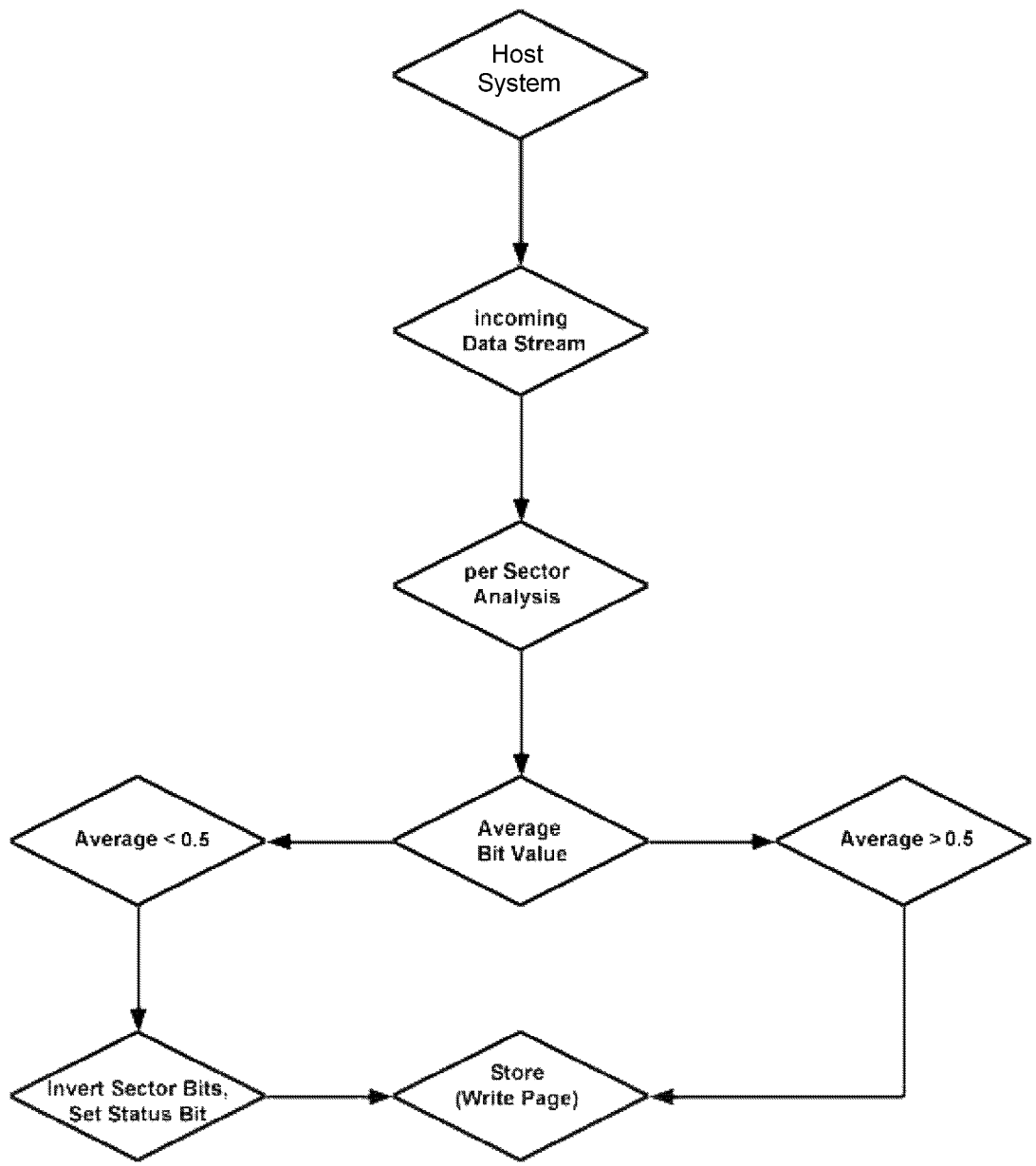
FIG. 2 shows a process flow through a NAND flash memory component, starting with receiving a data stream from a host system until data are stored in a page of the memory component, wherein an average bit value is compared against a threshold value of 0.5 to initiate either bit-inversion or as-is writing to the page.

The current invention is directed to solving the problem of excessive program/erase (P/E) wear in non-volatile solid-state memory components used in mass storage devices of types suitable for use with host computers and other processing apparatuses, including but not limited to NAND flash memory and Phase Change Memory (PCM) memory components. As previously discussed, NAND flash memory is illustrative of a type of solid-state memory device comprising memory cells that can only be programmed from high to low bit values, and any reverse programming requires complete erasing of an entire block containing multiple pages of memory cells. As previously noted, pages typically constitute the smallest functional or writable unit of a NAND flash memory component. A typical workload for a NAND flash memory-based mass storage device (for example, a solid-state drive) will, in most cases, entail a random distribution of 0 and 1 bit values in each page, though with notable exceptions. For example, in audio-visual contents, including pictures, video frames, and even web-pages, a black background will result in large areas of "000000" RGB values, that, depending on the format in which the images are stored, will span multiple pages. Likewise, any other dark background will be stored with a low average bit value over a substantial range of NAND flash memory pages. Other workloads will abide by similar rules, meaning that, especially when looking at smaller units of data like logical sectors, which correspond to NAND flash memory pages, a preponderance of either 0 or 1 bit values will occur. This preponderance or bias to one or the other bit value is currently reduced by encrypting data. However, encryption only evens out the bias without reducing the P/E load.

According to one embodiment of the invention, an average bit value can be computed for each unit of data transmitted to pages of a NAND flash memory component and compared against a predefined threshold value so that, if appropriate, a bit value inversion can be performed on the data for the purpose of reducing the number of program or erase pulses per P/E cycle to which individual cells of the memory component are subjected. The average bit value may be, for example, the calculated arithmetic mean of the bit values on a page. As an example, FIG. 1 represents different bit values across a page or 4 kByte sector of data to be written to a NAND flash memory component that is adapted to use an 8 bits/Byte conversion for 32768 bits, in which case the calculation of an average bit value for the data would entail summing the bit values of bit #0 through bit #32767, and then dividing this sum by 32768.

When data are written to a page of NAND flash memory, a flash memory controller (typically located on the same substrate as the flash memory components) automatically generates parity or ECC data and writes check-data as well. The check-data are written to either the same page or to a different physical location in the array of flash memory components, which may be in the same or a different block of memory components, depending on the controller and firmware used. In order to generate the check-data, however, the controller has to be aware of the data contents, that is, the individual bit values in each sector/page. In so far, there is very little if any extra work required of the controller to analyze the data with respect to the weighting of the distribution of 0 vs. 1 bit values within a page. Consequently, with minimal processing overhead over existing protocols, the average bit value for each page can be determined by the controller and compared against a predefined threshold value. In most cases, this threshold value can be set at a value of about 0.5, though the use of other threshold values is foreseeable, for example, depending on empirical reliability data. Likewise, instead of an arithmetic mean, other algorithms may be used, for example, the geometric mean or any other function capable of taking into account pattern analysis and/or clustering of data. Such alternatives may be employed to generate an average bit value that can be useful for a particular purpose.

FIG. 2 represents the above-described process flow, starting with a NAND flash memory component receiving a data stream from a host system. Before committing the data to the memory component for permanent storage, an analysis is performed of the bit levels of the data on a per sector basis. The file system address of the data location, which could be according to a file allocation table (FAT), Windows NT file system (NTFS) or any other suitable file system, is translated from a logical block address into a physical flash memory address via a flash translation layer of the controller, to generate the physical address using block and page addresses. At any time, an average bit value can be computed by the controller for each sector, and the computed average bit value is then compared to a threshold value, which in the example is 0.5. If the average bit value is above the predetermined threshold value, indicating that the sector has a preponderance of "1" bit values (in other words, cells in the fully erased state), no further manipulations are necessary and the data can be committed to the memory component "as is." On the other hand, if the data within the sector exhibit a preponderance toward "0" bit values (in other words, fully programmed cells) as determined by an average bit value below the threshold value, then the bit values are inverted and the inverted values are stored. In this manner, the programming load (number of programming pulses) and the "harshness" of the erase load on a page of a NAND flash memory component can be minimized even if the number of P/E cycles is not altered as compared to a conventional programming mode.

A flag or some other suitable indication is preferably employed to mark or otherwise identify that the page contains (or does not contain) inverted bit values. A suitable flag is an inversion bit that can be part of the data being stored or, in the case of a flash memory controller that performs error checking and correction (ECC) for the NAND flash memory component and writes ECC values to the memory component, the inversion bit can be written as part of the ECC values.

The threshold value for inversion or non-inversion can be, in the simplest case, a numerical value of 0.5 against which the average of all bits is compared. However, depending on specific properties of the memory component, higher or lower threshold values are possible. Factors influencing the threshold value may, as nonlimiting examples, include the age or wear or even programming history of the memory component, or environmental factors such as temperature or program frequency.

Techniques for performing bit inversion are well established in the art and can be performed by a simple inversion circuitry or with software at either the drive level (mass storage device) or system level (host computer system). Because data are encrypted at the system level using the well-known 8b/10b encoding scheme, each sector written to the mass storage device will be written to a page as transferred from the host to the NAND flash memory component. Therefore, in some circumstances it may be advantageous to perform bit value inversion on the host level and add a corresponding bit to identify the inversion to each sector, for example, as the least or most significant bit (lsb or msb). Bit value inversion can be done in software by simply using a 1-X calculation, where X is the respective bit value. As represented in FIG. 3, this implementation of the invention still entails the calculation of an average bit value. For example, the calculation can entail summing the bit values of bit #0 through bit #40959, and then dividing this sum by 40960.

Another embodiment of the invention uses the sector alignment of standard file systems with the 4096 Byte page size of standard NAND flash memory to perform the data inversion on the host system while sending a status bit for the data to the mass storage device. This form of inversion can be initiated on the level of the driver through software operations or in the host bus adapter using integrated hardware instructions.

The effect of keeping the average bit values of a NAND flash memory component above a predetermined threshold is twofold. First, the general wear and tear on an array of NAND flash memory components can be expected to be considerably lower than if all cells were, on average, programmed to a lower bit value, corresponding to a higher programming activity that further requires higher erase activity. Consequently, the number of electrons required to tunnel through the tunnel oxide layer is considerably lower than if all cells were fully programmed and then fully erased. Moreover, it is conceivable that the bit value inversion as described will result in considerable power savings for both program and erase cycles.

Another implementation of the invention encompasses the use of other types of non-volatile memory technologies, such as phase change memory (PCM) or similar emerging storage technologies. In contrast to the NAND flash memory technology, most of these technologies may not require a pre-erase of the data structure before performing a new write operation, and therefore may be referred to as directly-rewritable. However, these technologies still require a substantial amount of energy in order to revert any bit from one state to the other, regardless of which direction the changes in bit values go. Therefore, instead of comparing the average bit value of a page (or other smallest functional or writable unit) to a predetermined threshold value associated with that page, as contemplated for the invention when implemented with NAND flash memory components, the implementation of the invention with certain non-volatile memory technologies may entail comparing a predetermined threshold value to the number of bit values that would change during a write operation to the smallest writable (functional) unit of the memory components or to a predefined size threshold to maintain a reasonable ratio between data and status (inversion) bits. In this case, a memory controller associated with the memory components reads pre-existing data on a functional unit to which a sector of data is to be written. Depending on how many bit values of the pre-existing data would be altered if the data sector is written to it, the controller either writes the data sector as-is to the functional unit or performs a bit-inversion of the data sector before writing the data sector to the functional unit. As done with the NAND flash memory components, the inverted data sector is preferably flagged.

Figure 4:
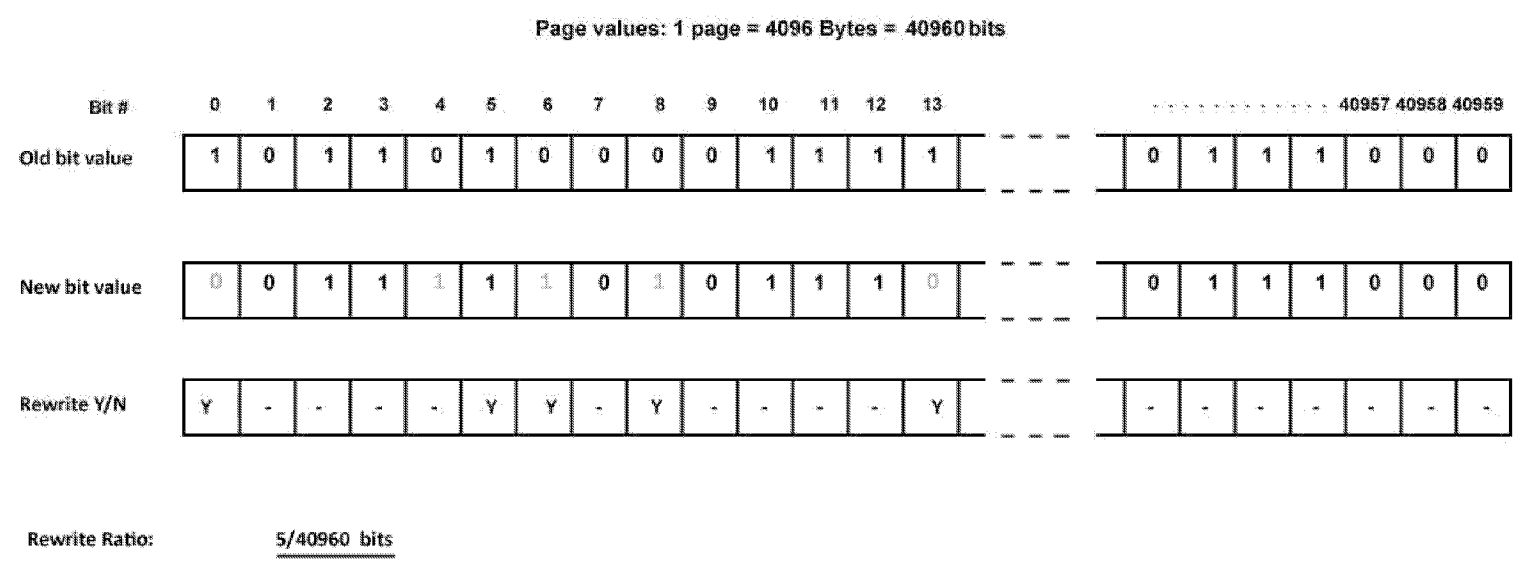
Figure 5:
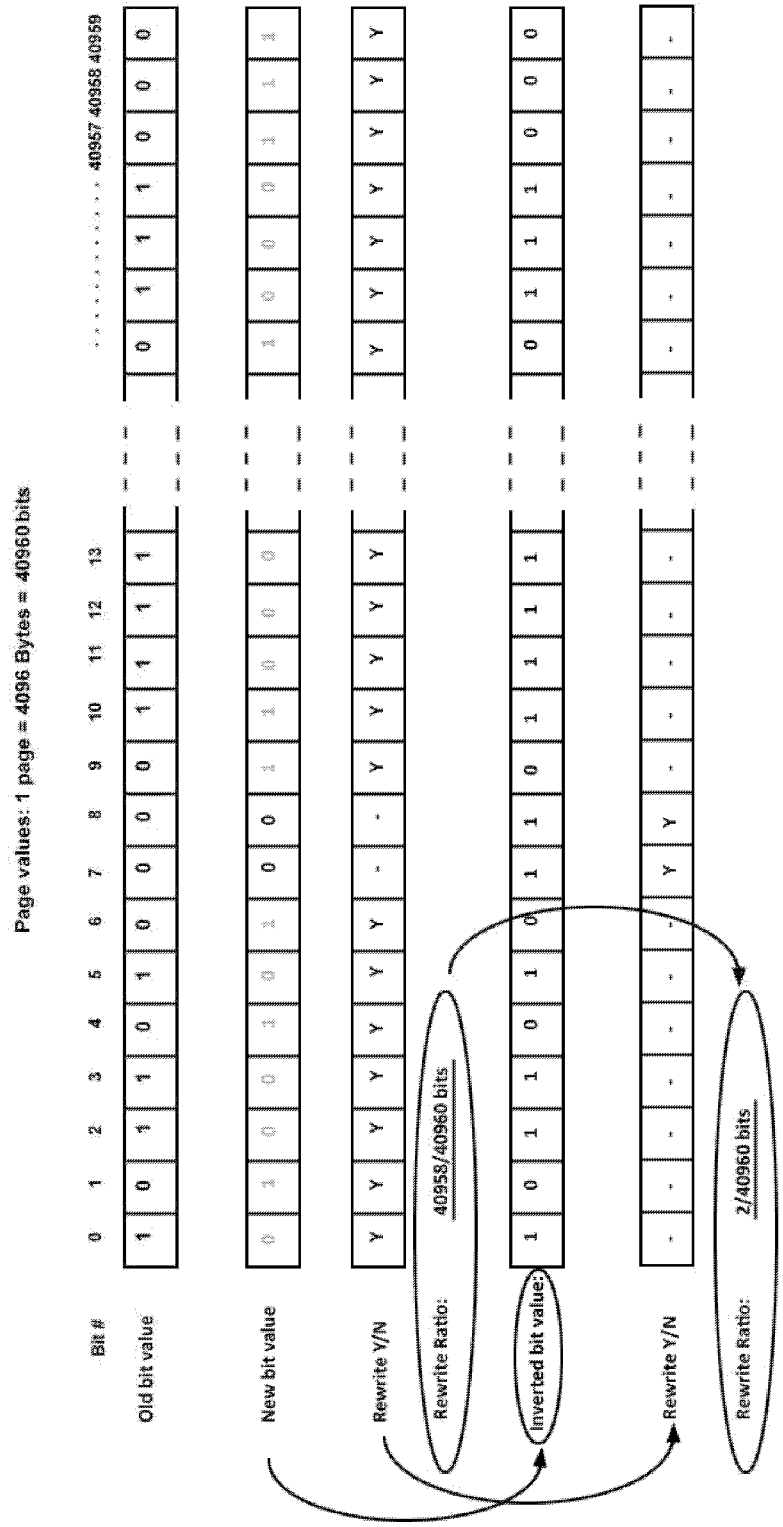

FIGS. 4 and 5 are representations of 4 kByte sectors of directly-rewritable non-volatile memory components that contain pre-existing data. In each case, a sector of data is to be stored in the sector containing the pre-existing data. In FIG. 4, the pre-existing data can be over-written without erasing and only a small number of bits need to be rewritten. In FIG. 5, almost all bit values of the data to be written are different from the pre-existing data. However, bit-inversion of the data to be written results in an almost perfect match of the two sets of data, so that only a small number of bits of the pre-existing data need to be changed.

If more than half of the bits of a non-volatile memory component need to be changed during a rewrite of a sector or other predefined size unit (for example, smallest writable unit) of the component, then it will typically be advantageous to apply bit value inversion which, especially in the case of multimedia contents, could change the number of bits to be rewritten from, for example, 80% to 20%. As a particular example, this scenario is commonly encountered when images are inverted in Adobe Photoshop or similar programs. Likewise, so-called checkerboard patterns are relatively common in data structures, and in this case, a 0% match may be converted into a 100% match by inverting the bit values. In other applications such as audio-visual editing, a 1:1 match or exclusion may not be that common. However, it is still likely to occur with a reasonably high frequency. Inversion of the data structure to match the existing data pattern would therefore dramatically reduce the number of cells that need to be physically altered. This, in turn, would dramatically change the power consumption of the memory device as well as reduce wear not only on the media but also on the access lines, which are becoming the focus of more attention with respect to burning out as designs move to smaller process nodes.

In view of the above, differentials in the energy required to alter a bit from one state to the other or vice-versa may be considered when setting the threshold value at which bit value inversion becomes advantageous. In the particular context of a solid-state memory component utilizing phase change technology, the difference in energy required for phase change from an amorphous to a crystalline phase or vice-versa should also be considered. That is, if rewriting of a bit in one direction requires twice the energy of that required for writing in the other direction, then the threshold value at which bit value inversion is initiated can be adjusted to accommodate this differential for the most energy efficient and least wear-intensive write process.

While the invention has been described in terms of specific embodiments, it is apparent that other forms could be adopted by one skilled in the art. For example, in addition to NAND flash and phase-change memory devices, any other non-volatile memory devices that benefit from lower bit-level programming could profit from the invention. A notable but nonlimiting example is resistive random access memory (RRAM) technologies. Therefore, the scope of the invention is to be limited only by the following claims.

The invention claimed is:

1. A method of managing a solid-state mass storage device adapted for use with a host computer system, the mass storage device comprising at least one non-volatile solid-state NAND flash memory component comprising memory cells organized in pages that are adapted to receive and store units of data transferred from the host computer system and correspond to the pages of the at least one memory component, the method comprising:

analyzing "0" and "1" bit values of units of data to be written to at least a first of the pages of the at least one memory component by calculating an average bit value of a first unit of data and comparing the average bit value against a predetermined threshold value; and inverting all bit values of the first unit of data before writing the first unit of data to the first page of the at least one memory component if the average bit value is below the threshold value and not inverting bit values of the first unit of data if the average bit value is above the threshold value.

2. A method of managing a solid-state mass storage device adapted for use with a host computer system, the mass storage device comprising at least one non-volatile solid-state memory component comprising memory cells organized in functional units that are adapted to receive and store units of data transferred from the host computer system and correspond to the functional units of the at least one memory component, the method comprising:

analyzing bit values of units of data to be written to at least a first of the functional units of the at least one memory component by reading pre-existing data stored in the first functional unit, comparing bit values of the pre-existing data to bit values of a first unit of data, and determining a ratio of a number of memory cells of the first functional unit whose bit values would be altered by writing the first unit of data thereto; and inverting all of the bit values of the first unit of data before writing the first unit of data to the first functional unit of the at least one memory component if the ratio is above a predetermined threshold value, wherein the at least one memory component is other than a NAND flash memory component and does not require a pre-erase operation before writing the units of data thereto.

3. The method of claim 2, wherein the at least one memory component is a phase change memory component.

4. The method of claim 2, further comprising, during writing of the first unit of data to the at least one memory component, writing a status bit to identify that the bit values of the first unit of data were inverted.

5. A solid-state mass storage device adapted for use with a host computer system, the solid-state mass storage device comprising:

at least one non-volatile solid-state memory component comprising memory cells organized in pages;

means for analyzing bit values in units of data to be written to the at least one memory component, each of the units of data corresponding to one of the pages in the at least one memory component;

means for computing an average bit value for each of the units of data; and means for performing a bit value inversion of at least a first of the units of data if the average bit value of the first unit of data is lower than a threshold value, the bit value inversion being performed before writing the first unit of data to the at least one memory component.

6. The solid-state mass storage device of claim 5, wherein the at least one solid-state memory component is a NAND flash memory component.

7. The solid-state mass storage device of claim 5, wherein the threshold value is 0.5.

8. The solid-state mass storage device of claim 5, wherein the threshold value is biased above or below 0.5.

9. The solid-state mass storage device of claim 5, wherein the analyzing means and the computing means comprise a flash memory controller of the mass storage device.

10. The solid-state mass storage device of claim 5, further comprising means for marking a page of the at least one memory component with an inversion bit if the bit values of the first unit of data are inverted before being written to the marked page.

11. The solid-state mass storage device of claim 10, wherein the inversion bit is part of data.

12. The solid-state mass storage device of claim 10, wherein the analyzing means and the computing means comprise a flash memory controller of the mass storage device.

13. The solid-state mass storage device of claim 12, wherein the flash memory controller performs error checking and correction (ECC) and writes ECC values to the at least one memory component, and wherein the inversion bit is written as part of the ECC values.

14. The solid-state mass storage device of claim 5, wherein the performing means is chosen from the group consisting of an inversion circuitry and software.

15. A solid-state mass storage device adapted for use with a host computer system, the solid-state mass storage device comprising:

at least one non-volatile solid-state memory component organized in functional units that are adapted to receive and store units of data transferred from the host computer system in the form of sectors having addresses and sizes corresponding to the functional units of the at least one memory component;

means for comparing bit values in the sectors of the data transferred from the host computer system to bit values of pre-existing data stored in the functional units of the at least one memory component to determine whether the bit values of the pre-existing data stored in any of the functional units are different from the bit values in the sectors of the data to be stored in the functional units;

means for performing a bit value inversion of at least a first of the sectors of the data if a number of bit values of the pre-existing data stored in a corresponding first of the functional units and determined to be different exceeds a threshold value, the bit value inversion being performed before writing the first sector of the data to the first functional unit of the at least one memory component.

16. The solid-state mass storage device of claim 15, wherein the at least one memory component is a directly-rewritable non-volatile memory component.

17. The solid-state mass storage device of claim 15, further comprising means for marking the first functional unit of the at least one memory component with an inversion bit if the bit values of the first sector of the data are inverted before being written to the first functional unit.

18. A host computer system having a solid-state mass storage device that interfaces with the host computer system so as to store data received from the host computer system on at least one non-volatile solid-state memory component of the mass storage device, the at least one memory component comprising memory cells organized in functional units that are adapted to receive units of the data received from the host computer system and correspond to the functional units of the at least one memory component, the host computer system comprising:

means for analyzing bit values of the units of data to be written to at least a first of the functional units of the at least one memory component by computing an average bit value for a first unit of data; and means for inverting bit values of the first unit of data to be written to the first functional unit of the at least one memory component before writing the first unit of data to the at least one memory component if the average bit value of the first unit of data is lower than a threshold value.

19. The host computer system of claim 18, wherein the at least one solid-state memory component is a NAND flash memory component.

20. The host computer system of claim 18, further comprising means for marking the first unit of data with an inversion bit if bit values of the first unit of data are inverted before being written to the at least one memory component.

21. The host computer system of claim 18, wherein the inverting means is chosen from the group consisting of an inversion circuitry and software.

\* \* \* \* \*